United States Patent
Shiraishi

(10) Patent No.: US 6,898,841 B2
(45) Date of Patent: May 31, 2005

(54) MANUFACTURING METHOD OF HEAD GIMBAL ASSEMBLY

(75) Inventor: Masashi Shiraishi, Kwai Chung (HK)

(73) Assignee: Sea Magnetics (H.K.) Ltd., Kwai Chung (CN)

( * ) Notice: Subject to any disclaimer, the term of this patent is extended or adjusted under 35 U.S.C. 154(b) by 0 days.

(21) Appl. No.: 10/229,146

(22) Filed: Aug. 28, 2002

(65) Prior Publication Data

US 2003/0007289 A1 Jan. 9, 2003

Related U.S. Application Data

(62) Division of application No. 09/993,497, filed on Nov. 27, 2001, now Pat. No. 6,636,382.

(30) Foreign Application Priority Data

Dec. 27, 2000 (JP) .................................. 2000-397006

(51) Int. Cl.[7] .......................... G11B 5/127; H04R 31/00
(52) U.S. Cl. .................. 29/603.4; 29/603.7; 360/244.3; 360/245.1
(58) Field of Search .................. 29/603.3–603.18; 216/22, 57, 67, 105, 106; 360/240, 244.2, 244.3, 244.8, 245, 245.1, 245.3, 245.5, 244.9

(56) References Cited

U.S. PATENT DOCUMENTS

| | | | | |
|---|---|---|---|---|
| 5,986,853 A | * | 11/1999 | Simmons et al. | 360/245.9 |
| 6,115,220 A | * | 9/2000 | Khan et al. | 360/244.2 |
| 6,215,622 B1 | * | 4/2001 | Ruiz et al. | 360/244.3 |
| 6,433,967 B1 | * | 8/2002 | Arya | 360/244.8 |

* cited by examiner

*Primary Examiner*—A. Dexter Tugbang
*Assistant Examiner*—Donghai D. Nguyen
(74) *Attorney, Agent, or Firm*—Armstrong, Kratz, Quintos, Hanson & Brooks, LLP

(57) ABSTRACT

A multilayer suspension includes a resilient bending section formed by partially removing at least part of layers of a five-layer structure which includes a first metal thin plate layer, a first resin layer laminated on the first metal thin-plate layer, a second metal thin-plate layer laminated on the first resin layer, a second resin layer laminated on the second metal thin-plate layer, and a conductive layer laminated on the second resin layer, a resilient gimbal section for mounting a head slider, formed by partially removing at least part of layers of the five-layer structure, and a rigid section for coupling the bending section and the gimbal section, formed by partially removing at least part of layers of the five-layer structure. An HGA includes thus formed multilayer suspension and a head slider mounted on the multilayer suspension and provided with at least one head element.

13 Claims, 6 Drawing Sheets

MANUFACTURING METHOD OF HEAD GIMBAL ASSEMBLY

This application is a divisional application of prior application Ser. No. 09/993,497 filed Nov. 27, 2001, now U.S. Pat. No. 6,636,382 B2.

FIELD OF THE INVENTION

The present invention relates to a multilayer suspension for supporting a flying head slider provided with a magnetic thin-film head element or an optical head element, to a head gimbal assembly (HGA) provided with the multilayer suspension, and to a manufacturing method of the HGA.

DESCRIPTION OF THE RELATED ART

In a magnetic hard disk drive (HDD) unit, magnetic write head elements for writing magnetic information onto magnetic hard disks and magnetic read head elements for reading magnetic information from the magnetic hard disks are in general formed on magnetic head sliders flying in operation above the rotating magnetic disks. The sliders are supported at top end sections of suspensions of HGAs, respectively.

Recent ever-increasing demands for downsizing of the HDD unit and for increasing of data storage capacities and densities in the HDD unit advance further miniaturization and weight reduction of the magnetic head slider and further increasing rotational speed of the magnetic hard disk.

A suspension for supporting such miniaturized and light-weighted magnetic head slider needs not only to precisely control a load applied to the magnetic head slider by properly adjusting its stiffness or rate of spring but also to more improve its windage-resistance performance and its vibration performance.

The windage of the suspension caused by the side wind produced by high-speed rotation of the magnetic hard disk will greatly influence the attitude of the flying magnetic head slider. In order to decrease the windage, it is necessary to make the thickness of the suspension as thin as possible. However, if the thickness is too thin, since the rigidity of the suspension itself will fall, its vibration performance deteriorates.

There are two kinds of suspension provided with a possibility of solving these mutually contradictory problems.

One is a partial etching suspension. A load beam of this partial etching suspension is made from a relatively thick stainless steel plate with a thickness of 100 $\mu$m for example. Only a bending section or load adjusting section of the load beam is half-etched to reduce its stiffness. Thus, no excess load will be induced at the top end section of the load beam even if the bending section is bent to a considerable extent, and also the rigidity of the remaining section of the load beam can be ensured. This suspension is completed by fixing an independent flexure provided with lead conductors to thus configured load beam by laser welding.

The other one is a multipart suspension. A load beam of this multipart suspension is made from a relatively thick stainless steel plate to improve the windage-resistance performance and the vibration performance. The load beam and a base plate are coupled by a resilient hinge made from a relatively thin stainless steel plate. The hinge configures a bending section or load adjusting section of the load beam to adjust the stiffness. Fixing of the hinge with the load beam and the base plate is executed by laser welding. Then, the suspension is completed by fixing an independent flexure provided with lead conductors to the load beam by laser welding.

These partial etching suspension and multipart suspension have however following problems.

The partial etching suspension is fabricated by etching a part of the load beam to a desired depth so as to adjust its stiffness. Since the stiffness changes depending upon the remaining thickness of the etched part, if the etching condition varies, the obtained stiffness will change accordingly. Therefore, it is quite difficult to always fabricate the suspension with an optimum constant stiffness. When fabricating this partial etching suspension, it is necessary to assemble the independent flexure with the load beam by laser welding. Thus, the laser welding process is additionally needed. Also, since the alignment of the flexure with respect to the load beam is difficult to execute with high accuracy, a high precision suspension cannot be expected.

The multipart suspension can be always fabricated to have an optimum stiffness because the hinge determines its stiffness. However, additional laser welding processes for fixing the hinge to the base plate, for fixing the load beam to the hinge and for fixing the flexure to the load beam are needed. Also, since the alignments of the independent components such as the flexure, load beam, hinge and base plate are difficult to execute with high accuracy, a high precision suspension cannot be expected.

SUMMARY OF THE INVENTION

It is therefore an object of the present invention to provide a multilayer suspension, an HGA provided with the multilayer suspension, and a manufacturing method of the HGA, whereby the number of laser welding processes during fabrication of the suspension can be greatly reduced and the precision of the suspension can be extremely improved.

Another object of the present invention is to provide a multilayer suspension, an HGA provided with the multilayer suspension, and a manufacturing method of the HGA, whereby a windage-resistance performance and a vibration performance of the suspension can be improved while optimally keeping its stiffness or rate of spring.

According to the present invention, a multilayer suspension includes a resilient bending section formed by partially removing at least part of layers of a five-layer structure which includes a first metal thin-plate layer, a first resin layer laminated on the first metal thin-plate layer, a second metal thin-plate layer laminated on the first resin layer, a second resin layer laminated on the second metal thin-plate layer, and a conductive layer laminated on the second resin layer, a resilient gimbal section for mounting a head slider, formed by partially removing at least part of layers of the five-layer structure, and a rigid section for coupling the bending section and the gimbal section, formed by partially removing at least part of layers of the five-layer structure.

Also, according to the present invention an HGA includes thus formed multilayer suspension and a head slider mounted on the multilayer suspension and provided with at least one head element.

Since the multilayer suspension is fabricated by partially removing at least part of layers of the five-layer structure without assembling individually separated parts, the number of mechanical connections or couplings of parts can be minimized. Therefore, the number of laser welding processes during fabrication of the suspension and the HGA can be greatly reduced and the precision of the suspension and the HGA can be extremely improved. Also, since it is possible to ensure the rigidity, a vibration performance of the suspension and the HGA can be improved. Furthermore, since the thickness can be reduced, a windage-resistance performance of the suspension and the HGA can be also improved. Of course, it is possible to precisely control the stiffness of the suspension.

It is preferred that, in the bending section, at least the first metal thin-plate layer is selectively removed. Since the first metal thin-plate layer is fully removed, stiffness in this section can be precisely reduced to a desired value.

It is also preferred that, in the bending section, the first metal thin-plate layer and the first resin layer are selectively removed. Because the first resin layer is additionally and fully removed, the stiffness in this section can be further reduced.

It is preferred that, in the bending section, at least one via hole is formed. By forming the via hole or holes, the stiffness can be delicately adjusted and the weight of the suspension and the HGA can be reduced.

It is also preferred that, in the rigid section, at least, the first metal thin-plate layer, the first resin layer and the second metal thin-plate layer are remained. Since the two metal layers and the resin layer between them are remained, sufficient rigidity can be ensured.

Preferably, in the rigid section, at least one via hole is formed to reduce the weight of the suspension and the HGA.

It is preferred that, in the gimbal section, the first metal thin-plate layer and the first resin layer are selectively removed. Thus, the stiffness in this section can be greatly and precisely reduced.

It is preferred that, in the gimbal section, a gimbal via hole is formed in its center. In this case, preferably, the first metal thin-plate layer has a dimple passing through the gimbal via hole, for directly depressing a rear surface of the head slider to be mounted on the gimbal section.

It is further preferred that the conductive layer consists of patterned trace conductors and patterned connection pads. Since the trace conductors and the connection pads and also the insulation layer or the second resin layer under them are patterned from the single piece layers, no retrofitting process is necessary and no misalignment will occur. As a result, a high precision suspension can be expected.

It is preferred that the first and second metal thin-plate layers are formed by stainless steel thin plates, that the first and second resin layers are formed by polyimide resin layers, and/or that the conductive layer is formed by a copper layer.

According to the present invention, furthermore, a manufacturing method of an HGA includes a step of preparing a five-layer sheet which includes a first metal thin-plate layer, a first resin layer laminated on the first metal thin-plate layer, a second metal thin-plate layer laminated on the first resin layer, a second resin layer laminated on the second metal thin-plate layer, and a conductive layer laminated on the second resin layer, a step of forming a multilayer suspension by partially removing at least part of layers of the five-layer sheet, the multilayer suspension including a resilient bending section, a resilient gimbal section for mounting a head slider and a rigid section for coupling the bending section and the gimbal section, and a step of fixing the head slider having at least one head element on the gimbal section of the multilayer suspension.

Since an HGA is assembled using a multilayer suspension body fabricated by partially removing at least part of layers of the five-layer structure without assembling individually separated parts, the number of mechanical connections or couplings of parts can be minimized. Therefore, the number of laser welding processes during fabrication of the suspension and the HGA can be greatly reduced and the precision of the suspension and the HGA can be extremely improved. Also, since it is possible to ensure the rigidity, a vibration performance of the suspension and the HGA can be improved. Furthermore, since the thickness can be reduced, a windage-resistance performance of the suspension and the HGA can be also improved. Of course, it is possible to precisely control the stiffness of the suspension.

It is preferred that the forming step includes selectively etching and removing, in the bending section, at least the first metal thin-plate layer. Since the first metal thin-plate layer is fully removed by selective etching, stiffness in this section can be precisely reduced to a desired value.

It is also preferred that the forming step includes selectively etching and removing, in the bending section, the first metal thin-plate layer and the first resin layer, respectively. Because the first resin layer is additionally and fully removed by selective etching, the stiffness in this section can be further reduced.

It is further preferred that the forming step includes forming, in the bending section, at least one via hole by etching. By forming the via hole or holes, the stiffness can be delicately adjusted and the weight of the suspension and the HGA can be reduced.

It is preferred that the forming step includes remaining, in the rigid section, at least, the first metal thin-plate layer, the first resin layer and the second metal thin-plate layer. Since the two metal layers and the resin layer between them are remained, sufficient rigidity can be ensured.

In this case, it is preferred that, in the rigid section, the first resin layer has a thickness to form a damper structure.

It is also preferred that the forming step includes forming, in the rigid section, at least one via hole by etching to reduce the weight of the suspension and the HGA.

It is further preferred that the forming step includes selectively etching and removing, in the gimbal section, the first metal thin-plate layer and the first resin layer, respectively. Thus, the stiffness in this section can be greatly and precisely reduced.

It is preferred that the forming step includes forming, in the gimbal section, a gimbal via hole in the center by etching. In this case, preferably, the forming step includes forming a dimple passing through the gimbal via hole, for directly depressing a rear surface of the head slider by stamping the first metal thin-plate layer.

It is also preferred that the forming step includes forming trace conductors and connection pads by patterning the conductive layer. Since the trace conductors and the connection pads and also the insulation layer or the second resin layer under them are patterned from the single piece layers, no retrofitting process is necessary and no misalignment will occur. As a result, a high precision suspension can be expected.

It is preferred that the first and second metal thin-plate layers are formed by stainless steel thin plates, that the first and second resin layers are formed by polyimide resin layers, and/or that the conductive layer is formed by a copper layer.

It is also preferred that the forming step includes forming a multilayer suspension by partially removing at least part of layers of the five-layer sheet by selective etching.

Further objects and advantages of the present invention will be apparent from the following description of the preferred embodiments of the invention as illustrated in the accompanying drawings.

DESCRIPTION OF THE PREFERRED EMBODIMENTS

Figure 1:
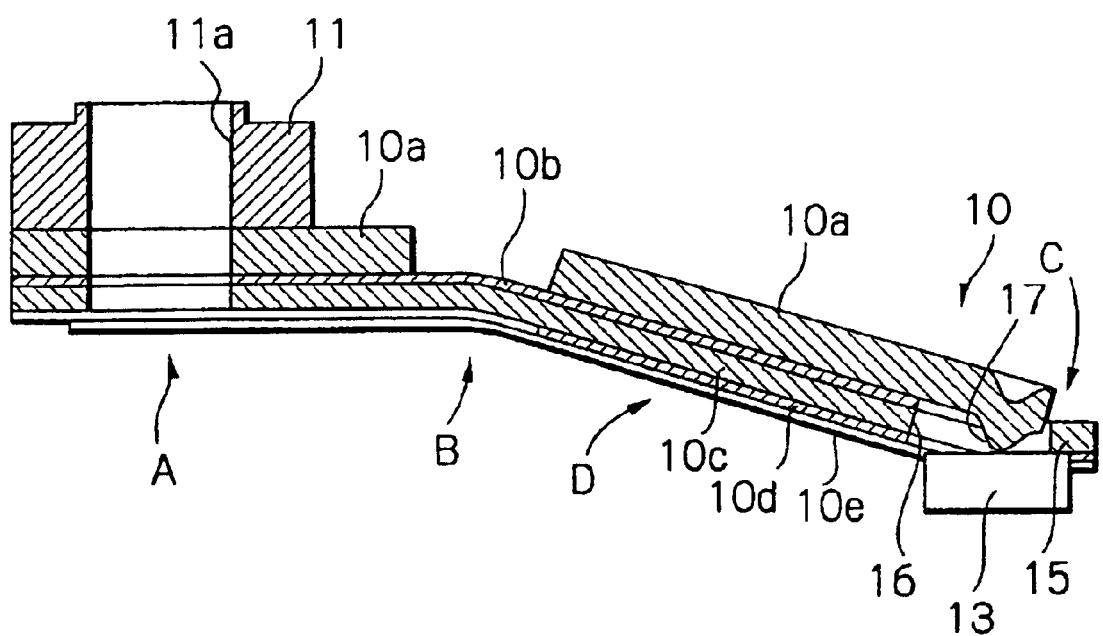
FIG. 1 shows a center line sectional view schematically illustrating the whole of an HGA as a preferred embodiment according to the present invention.
Figure 2:
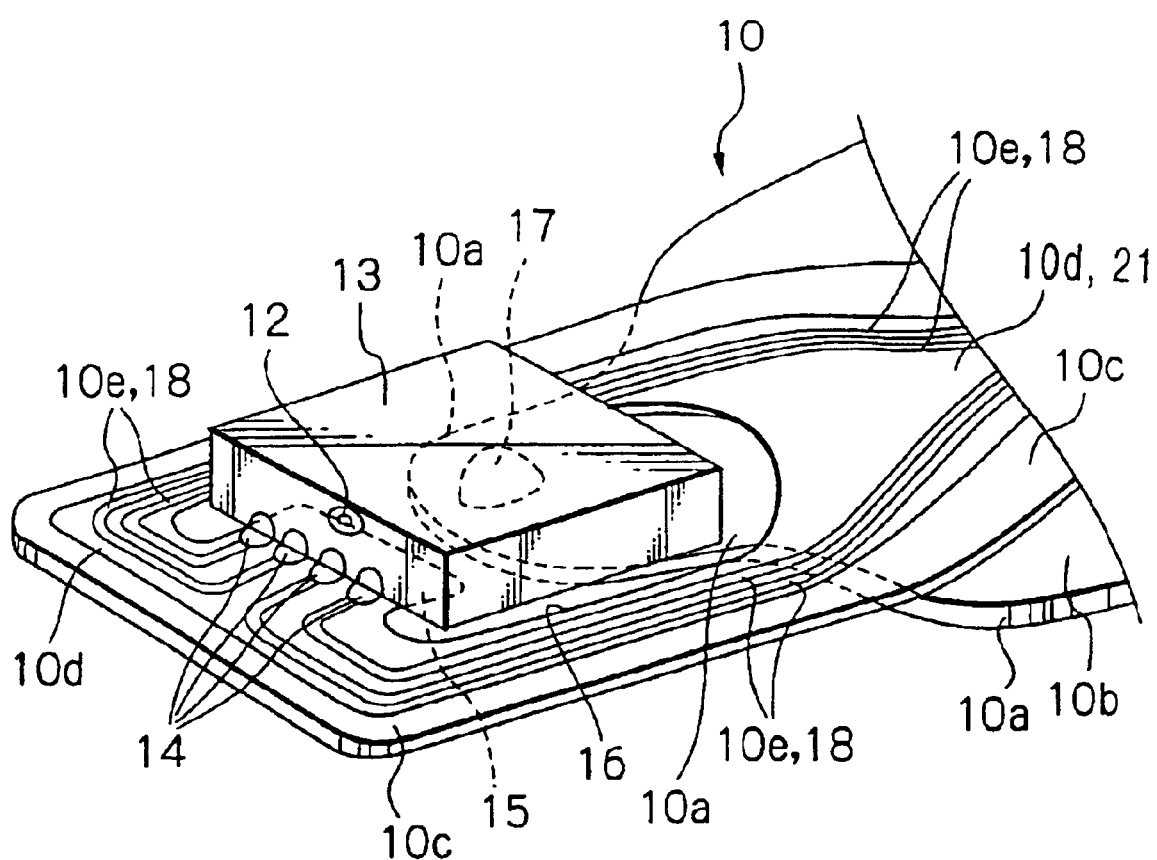
FIG. 2 shows an enlarged oblique view illustrating a top end section of the HGA shown in FIG. 1.

FIG. 1 schematically illustrates the whole of an HGA as a preferred embodiment according to the present invention, and FIG. 2 illustrates a top end section of this HGA shown in FIG. 1.

As shown in these figures, the HGA in this embodiment has a five-layer suspension body 10, a base plate 11 fixed to a base end section of the suspension body 10, and a flying magnetic head slider 13 provided with a thin-film magnetic head element 12, fixed to a top end section of the suspension body 10.

Terminal electrodes of the thin-film magnetic head element 12 are electrically and mechanically connected to head connection pads 14 formed on the suspension body 10 by ball bonding using for example Au balls or solder balls, respectively.

The suspension body 10 has a five-layer structure formed in a single piece by sequentially laminating a first stainless steel thin plate 10a with a relatively large thickness (larger thickness than that of a second stainless steel thin plate 10c), a first resin layer 10b, a second stainless steel thin plate 10c with a relatively small thickness (smaller thickness than that of the first stainless steel thin plate 10a), a second resin layer 10d and a copper layer 10e patterned as trace conductors and connection pads. In this embodiment, the first stainless steel thin plate 10a is made of for example SUS304TA with a thickness of about 60 μm. The first resin layer 10b is made of polyimide with a thickness of about 10 μm. The second stainless steel thin plate 10c is made of for example SUS304TA with a thickness of about 20–25 μm which is thinner than that of the first stainless steel thin plate 10a. The second resin layer 10d is made of polyimide with a thickness of about 10 μm. The copper layer 10e is made of copper with a thickness of about 10 μm.

This suspension body 10 is sectioned into a base section A fixed to the base plate 11, a resilient bending section B continuously following to the base section A, a resilient gimbal section C on which the magnetic head slider 13 is mounted, and a rigid section D continuously following to the bending section B and to the gimbal section C, for coupling these sections B and C. Each of these sections A-D are formed by partially and selectively etching at least one layer of the five-layer structure.

In the bending section B, according to this embodiment, all of the first stainless steel thin plate 10b is etched and removed to reduce stiffness in this section to a desired value. The first resin layer 10b and the second stainless steel thin plate 10c are remained as they are and the second resin layer 10d and the copper layer 10e are patterned and remained.

Figure 4:
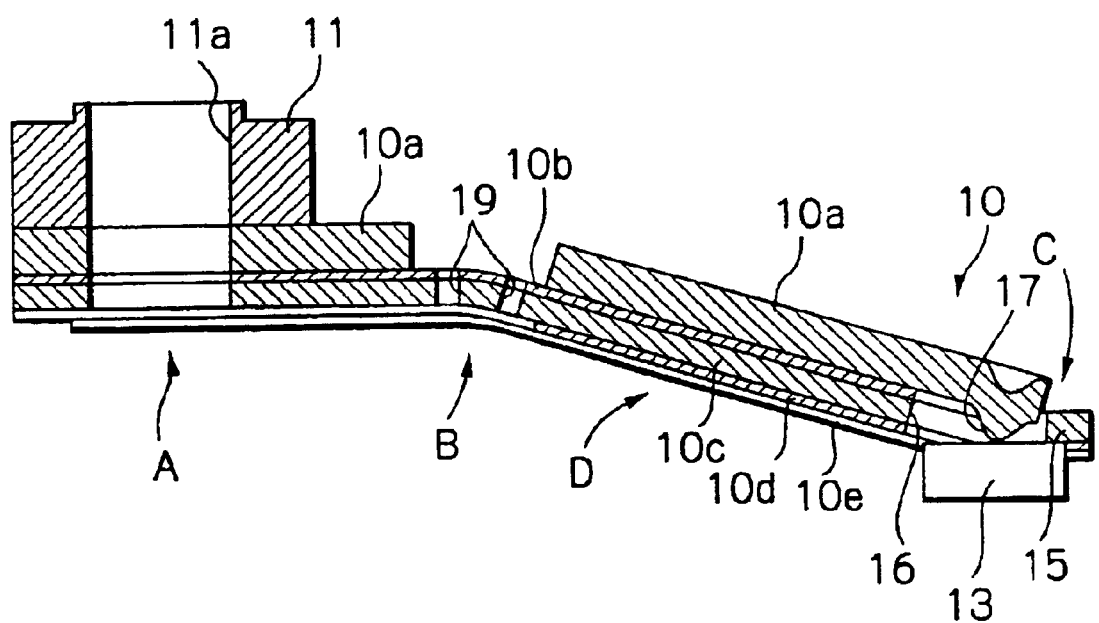
FIG. 4 shows a center line sectional view schematically illustrating the whole of an HGA as a modification of the embodiment shown in FIG. 1.

As shown in FIG. 4, in a modification of this embodiment, one or a plurality of via holes 19 may be formed in this bending section B. By forming the via hole or holes 19, the stiffness can be more precisely adjusted and the weight of the whole suspension can be reduced. The other configurations, operations and advantages in this modification are the same as those of the embodiment of FIG. 1.

According to the embodiment of FIG. 1, the first stainless steel thin plate 10a, the first resin layer 10b and the second stainless steel thin plate 10c are remained as they are in the base section A and the rigid section D. Thus, a desired rigidity can be ensured resulting a deformation of these sections to prevent. In addition, since the side edges of the rigid section D are not bent but formed in flat, air-resistance against the side wind can be reduced to improve the windage-resistance performance. In these sections A and D, the second resin layer 10d and the copper layer 10e are patterned and remained.

Figure 5:
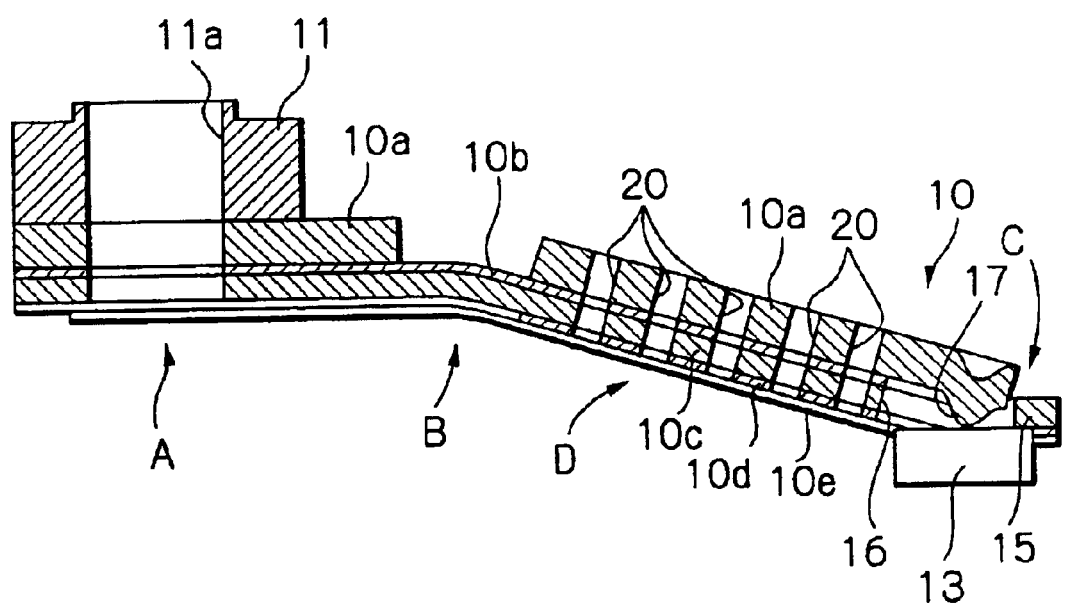
FIG. 5 shows a center line sectional view schematically illustrating the whole of an HGA as another modification of the embodiment shown in FIG. 1.

As shown in FIG. 5, in another modification of this embodiment, one or a plurality of via holes 20 may be formed in the rigid section D. By forming the via hole or holes 20, the weight of the whole suspension can be reduced. The other configurations, operations and advantages in this modification are the same as those of the embodiment of FIG. 1.

According to the embodiment of FIG. 1, the gimbal section C is substantially configured by the second stainless steel thin plate 10c. Therefore, the stiffness in this gimbal section C is reduced to have a desired resilience for mounting the magnetic head slider 13. Namely, in the gimbal section C, a flexible tongue 15 having elasticity for flexibly supporting the magnetic head slider 13 to provide a free attitude is formed. Mounting of the magnetic head slider 13 on the suspension is performed by adhering it to the flexible tongue 15 and by bonding the terminal electrodes of the thin-film magnetic head element 12 to the head connection pads 14.

A via hole 16 into which a free end of the magnetic head slider 13 is capable of getting is opened at the center of this gimbal section C. One end section of the first stainless steel thin plate 10a, which has a projection or dimple 17, extends to the via hole 16 so that the dimple 17 passing through the via hole 16 directly depresses a rear surface of the magnetic head slider 13. In the section C, the second resin layer 10d and the copper layer 10e are patterned and remained.

Over all the sections A to D, the copper layer 10e is patterned to form trace conductors 18, the head connection pads 14 and external connection pads (not shown) and the second resin layer 10d is patterned to form an insulation layer 21 located under the patterned copper layer 10e.

The base plate 11 is made of in this embodiment a stainless steel or iron plate with a thickness of about 300 μm and fixed to the base section A of the suspension body 10 by laser welding. The HGA is attached to a drive arm (not shown) by fixing the base plate 11 at its attaching hole 11a.

Fixing of the magnetic head slider 13 to the suspension body 10 may be performed only by bonding of its terminal electrodes to the head connection pads 14 without using adhesive.

FIG. 3a to 3f illustrate manufacturing processes of the suspension in this embodiment. Hereinafter, with reference to these figures, a manufacturing method of the suspension will be described in detail. In order to simplify explanations, only a single suspension is expressed in these figures. However, actually, many suspensions are formed on the same multilayer sheet, and are separated into individual pieces thereafter.

Figure 3A:
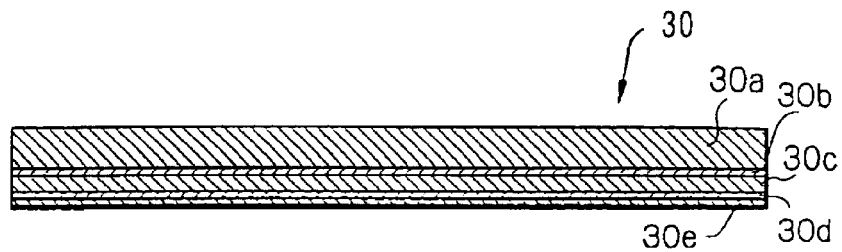
FIGS. 3a to 3f show a center line sectional view illustrating manufacturing processes of a suspension in the embodiment shown in FIG. 1.

First, as shown in FIG. 3a, a five-layer sheet 30 formed in a single piece by sequentially laminating a first stainless steel thin plate 30a, a first polyimide layer 30b, a second stainless steel thin plate 30c, a second polyimide layer 30d and a copper layer 30e is prepared. Such five-layer sheet may be fabricated by inserting adhesive polyimide sheets between the first and second stainless steel thin plates and between the second stainless steel thin plate and a copper thin plate or copper foil for the copper layer, respectively, and then by pressing under heating these laminated five sheets so as to be integrated. Alternately, the five-layer sheet may be fabricated by coating liquid state polyimide on one surfaces of the first and second stainless steel thin plates, on the other surface of the second stainless steel thin plate and on one surface of the copper thin plate, and then by laminating and pressing these plates under half cured state of the polyimide so as to be integrated. However, the fabrication method of the five-layer sheet 30 is not limited to these methods but any fabrication method can be used. For example, the copper layer 30e may be formed by sputtering or by plating in stead of using the copper thin plate.

In this embodiment, the first stainless steel thin plate 30a is formed to have a thickness of about 60 $\mu$m, the first polyimide layer 30b about 10 $\mu$m, the second stainless steel thin plate 30c about 20–25 $\mu$m, the second polyimide layer 30d about 10 $\mu$m and the copper layer 30e about 10 $\mu$m.

Figure 3B:
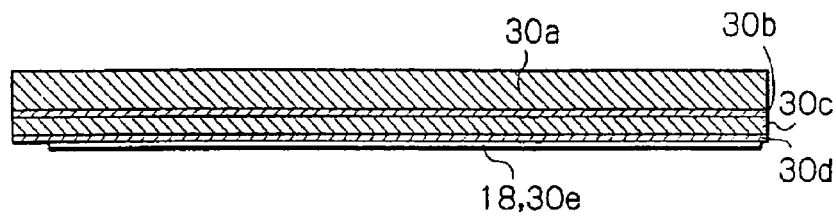

Then, as shown in FIG. 3b, the trace conductors 18, the head connection pads 14 and the external connection pads are formed by patterning the copper layer 30e. This patterning of the copper layer 30e is performed by etching the five-layer sheet 30 from its one surface or from its bottom surface in the figure.

In order to etch the copper layer 30e, acid such as $FeCl_3$ (ferric chloride) or $(NH_4)_2S$ (ammonium sulfide) may be used. Such acid will selectively etch copper only, but never acts on polyimide. Therefore, the second polyimide layer 30d operates as an etching stop layer and all the thickness of the copper layer 30e within the regions to be etched is completely etched or removed. In other words, the etched depth of the copper layer 30e can be certainly kept constant.

Figure 3C:
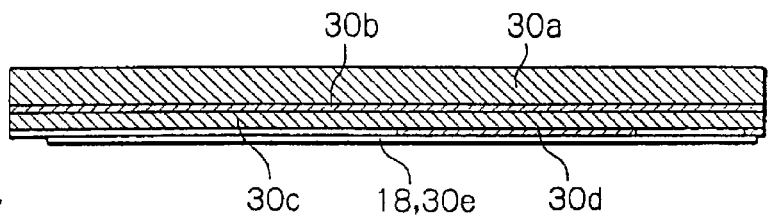

Then, as shown in FIG. 3c, all the thickness of the second polyimide layer 30d within partial regions is selectively removed by etching the five-layer sheet 30 from its bottom surface in the figure. By removing the partial regions, at least area of the second polyimide layer 30d for working as an insulation layer of the trace conductors 18, the head connection pads 14 and the external connection pads will remain.

In order to etch the polyimide layer 30d, a wet etching using alkali such as KOH (potassium hydroxide) or a dry etching using $O_2$ plasma or $CF_4$ plasma may be executed. Such etching will selectively etch polyimide only, but never acts on stainless steel. Therefore, the second stainless steel thin plate 30c operates as an etching stop layer and all the thickness of the second polyimide layer 30d within the regions to be etched is completely etched or removed. In other words, the etched depth of the polyimide layer 30d can be certainly kept constant.

Figure 3D:
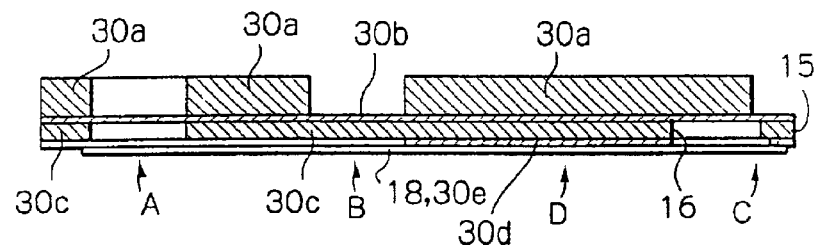

Then, as shown in FIG. 3d, all the thickness of the first stainless steel thin plate 30a within partial regions and all the thickness of the second stainless steel thin plate 30c within partial regions are selectively and simultaneously removed by etching the five-layer sheet 30 from its both surfaces or from its top and bottom surfaces in the figure. The partial regions of the first stainless steel thin plate 30a correspond to in the concrete a region for the attaching hole 11a of the base plate in the base section A, and to top end sections of the bending section B and the gimbal section C. The partial regions of the second stainless steel thin plate 30d correspond to in the concrete the region for the attaching hole 11a of the base plate in the base section A and to the via hole 16 in the gimbal section C.

In order to etch the stainless steel thin plates 30a and 30c, acid such as $FeCl_3$ (ferric chloride) may be used. Such acid will selectively etch stainless steel plates only, but never acts on polyimide. Therefore, the first polyimide layer 30b operates as an etching stop layer and all the thickness of the first and second stainless steel thin plates 30a and 30c within the regions to be etched is completely etched or removed even though having different thicknesses. In other words, the etched depth of the stainless steel plates 30a and 30c can be certainly kept constant.

Figure 3E:
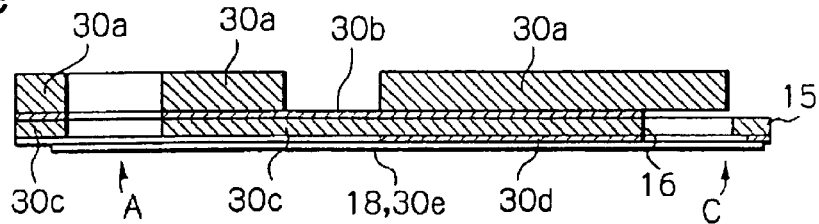

Then, as shown in FIG. 3e, all the thickness of the first polyimide layer 30b within partial regions is selectively removed by etching the five-layer sheet 30 from its both surfaces or from its top and bottom surfaces in the figure. The partial regions of the polyimide layer 30b correspond to in the concrete a region for the attaching hole 11a of the base plate in the base section A, and to the top end section of the gimbal section C.

Similar to the aforementioned process shown in FIG. 3c, a selective wet etching using alkali such as KOH (potassium hydroxide) or a selective dry etching using $O_2$ plasma or $CF_4$ plasma may be executed. In this case, the first and second stainless steel thin plates 30a and 30c operate as etching stop layers.

Figure 3F:
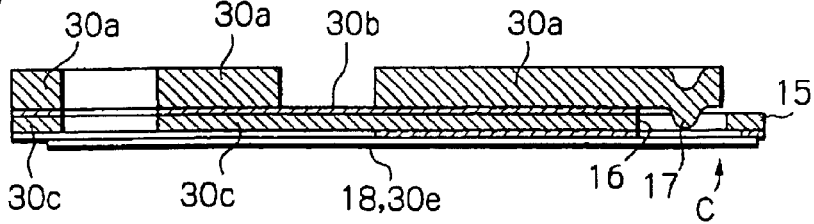

Then, as shown in FIG. 3f, the dimple 17 is formed in the gimbal section C of the first stainless steel thin plate 30a by stamping the plate 30a from the upper surface of the five-layer sheet 30 in the figure.

Thereafter, by fixing the base plate 11 to the suspension body, by fixing the magnetic head slider 13 to the suspension body, by bonding its terminal electrodes to the head connection pads 14, by mechanically bending the bending section B, and then by separating into the individual pieces, the HGA shown in FIG. 1 is completed.

As aforementioned, according to this embodiment and its modifications, since the suspension body is fabricated by partially etching and removing a part of layers of the five-layer sheet without assembling individually separated parts, the number of mechanical connections or couplings of parts can be minimized. Therefore, the number of laser welding processes during fabrication of the suspension and the HGA can be greatly reduced and the precision of the suspension and the HGA can be extremely improved. Also, since it is possible to ensure the rigidity, a vibration performance of the suspension and the HGA can be improved. Furthermore, since the thickness can be reduced, a windage-resistance performance of the suspension and the HGA can be also improved.

Moreover, since all the thickness within desired regions of each layer can be completely removed by the selective etching, it is possible to precisely control the stiffness of the suspension.

Furthermore, since the trace conductors and the connection pads and the insulation layer or the second polyimide layer under them are patterned from the single piece layers, no retrofitting process is necessary and no misalignment will occur. As a result, a high precision suspension can be expected.

Also, adopting suitable polyimide thickness as the resin layer 10*b*, it is possible to create a damper structure with the stainless steel thin plate 10*a*.

Figure 6:
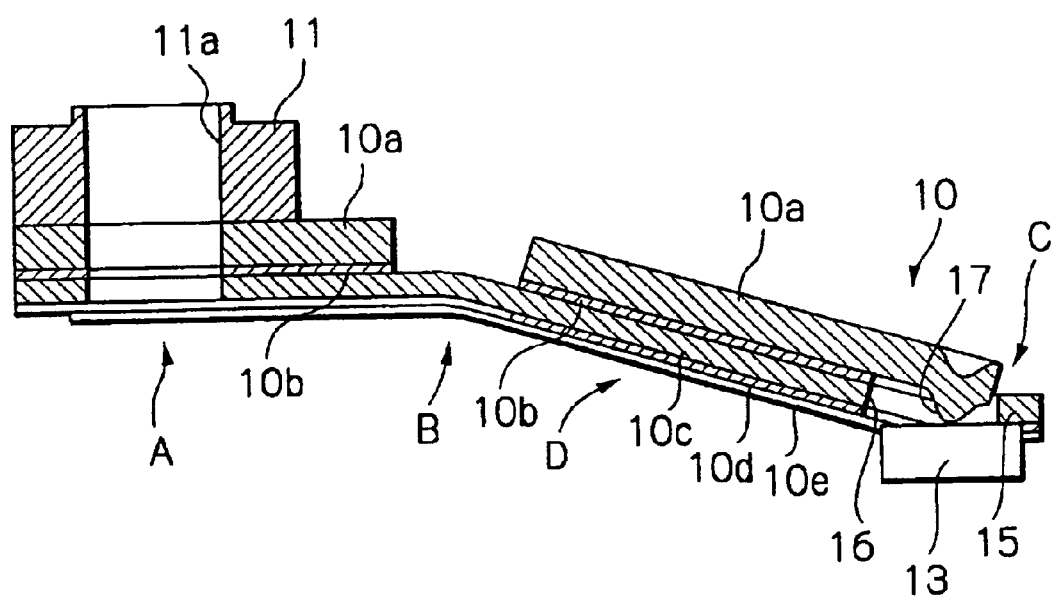
FIG. 6 shows a center line sectional view schematically illustrating the whole of an HGA as another embodiment according to the present invention.

FIG. 6 schematically illustrates the whole of an HGA as another embodiment according to the present invention.

In this embodiment, both the first stainless steel thin plate 10*a* and the first resin layer 10*b* are completely removed in the bending section B to more reduce the stiffness in this section B. The other configurations, operations and advantages in this embodiment are the same as those of the embodiment of FIG. 1. Thus, in this embodiment of FIG. 6, the same references are used for the similar components as those in the embodiment of FIG. 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. A manufacturing method of a head gimbal assembly, comprising the steps of:

preparing a five-layer sheet which includes a first metal thin-plate layer made of a stainless steel thin plate, a first resin layer laminated on said first metal thin-plate layer, a second metal thin-plate layer made of a stainless steel thin plate and laminated on said first resin layer, a second resin layer on said second metal thin-plate layer, and a conductive layer laminated on said second resin layer;

forming a multilayer suspension by partially removing at least part of layers of said five-layer sheet, said multilayer suspension comprising a resilient bending section, a resilient gimbal section for mounting a head slider and a rigid section for coupling said bending section and said gimbal section, wherein said resilient bending section and said resilient gimbal section are each formed by partially removing at least said first metal thin-plate layer and said rigid section is formed by partially removing at least one of the second resin layer and the conductive layer; and fixing the head slider having at least one head element on said gimbal section of said multilayer suspension.

2. The manufacturing method as claimed in claim 1, wherein said forming step comprises selectively etching and removing, in said bending section, at least said first metal thin-plate layer.

3. The manufacturing method as claimed in claim 1, wherein said forming step comprises selectively etching and removing, in said bending section, said first metal thin-plate layer and said first resin layer, respectively.

4. The manufacturing method as claimed in claim 1, wherein said forming step comprises forming, in said bending section, at least one via hole by etching.

5. The manufacturing method as claimed in claim 1, wherein said forming step comprises remaining, in said rigid section, at least, said first metal thin-plate layer, said first resin layer and said second metal thin-plate layer.

6. The manufacturing method as claimed in claim 1, wherein said forming step comprises forming, in said rigid section, at least one via hole by etching.

7. The manufacturing method as claimed in claim 1, wherein said forming step comprises selectively etching and removing, in said gimbal section, said first metal thin-plate layer and said first resin layer, respectively.

8. The manufacturing method as claimed in claim 1, wherein said forming step comprises forming, in said gimbal section, a gimbal via hole in the center by etching.

9. The manufacturing method as claimed in claim 8, wherein said forming step comprises forming a dimple passing through said gimbal via hole, for directly depressing a rear surface of said head slider by stamping said first metal thin-plate layer.

10. The manufacturing method as claimed in claim 1, wherein said forming step comprises forming trace conductors and connection pads by patterning said conductive layer.

11. The manufacturing method as claimed in claim 1, wherein said first and second resin layers are formed by polyimide resin layers.

12. The manufacturing method as claimed in claim 1, wherein said conductive layer is formed by a copper layer.

13. The manufacturing method as claimed in claim 1, wherein said forming step comprises forming said multilayer suspension by partially removing at least part of layers of said five-layer sheet by selective etching.

* * * * *

UNITED STATES PATENT AND TRADEMARK OFFICE
CERTIFICATE OF CORRECTION

PATENT NO. : 6,898,841 B2
APPLICATION NO. : 10/229146
DATED : May 31, 2005
INVENTOR(S) : Masashi Shiraishi Page 1 of 1

It is certified that error appears in the above-identified patent and that said Letters Patent is hereby corrected as shown below:

<u>On the title page in Item (73):</u>
change "Assignee: Sea Magnetics (H.K.) Ltd., Kwai Chung (CN)"
to be -- Assignee: SAE Magnetics (H.K.) Ltd., Kwai Chung (CN) --

Signed and Sealed this

Twenty-ninth Day of January, 2008

JON W. DUDAS
*Director of the United States Patent and Trademark Office*